United States Patent [19]
Ehiro

[11] Patent Number: 5,760,599
[45] Date of Patent: Jun. 2, 1998

[54] METHOD AND APPARATUS FOR TESTING SEMICONDUCTOR INTEGRATED CIRCUITS

[75] Inventor: Masayuki Ehiro, Nara, Japan

[73] Assignee: Sharp Kabushiki Kaisha, Osaka, Japan

[21] Appl. No.: 689,263

[22] Filed: Aug. 6, 1996

[30] Foreign Application Priority Data

Aug. 14, 1995 [JP] Japan .................... 7-207101

[51] Int. Cl.[6] ........................... G01R 31/26
[52] U.S. Cl. ........................... 324/765
[58] Field of Search ............... 324/765, 236, 324/763, 766, 767, 769; 371/22.5, 25.1

[56] References Cited

U.S. PATENT DOCUMENTS

| | | | |
|---|---|---|---|
| 4,100,532 | 7/1978 | Farnbach | 340/146.3 |
| 4,131,848 | 12/1978 | Battle | 324/236 |
| 4,468,614 | 8/1984 | Takahashi et al. | 324/78 D |
| 4,648,104 | 3/1987 | Yachida et al. | 377/54 |
| 4,710,704 | 12/1987 | Ando | 371/25.1 |
| 4,953,095 | 8/1990 | Ishikawa et al. | 364/484 |
| 5,057,774 | 10/1991 | Verhelst et al. | 371/22.5 |
| 5,321,354 | 6/1994 | Ooshima et al. | 324/765 |
| 5,521,524 | 5/1996 | Houston | 324/765 |

FOREIGN PATENT DOCUMENTS 5-273298  10/1993  Japan .
6-58981   3/1994   Japan .

Primary Examiner—Ernest F. Karlsen
Assistant Examiner—Anh Phung

[57] ABSTRACT

A current detecting resistance is inserted somewhere in a path for feeding a power source current to a supply voltage terminal VDD of a DUT from a power source of a testing apparatus, and from the potential difference at both ends, a pulse form change due to the state transition of a CMOS circuit in the DUT contained in the power source current is detected. The number of pulse form changes is counted by a counter. In the DUT, a test pattern is applied from a driver, an expected value preset according to the test pattern and the count of the counter are compared, and it is judged whether or not the DUT is in good quality. The current due to a pulse form transition to be detected by the current detecting resistance is larger than the current flowing when the CMOS circuit in the DUT is in a static state, and therefore, the resistance value of the current detecting resistance may be set smaller, so that the time required for testing may be shortened.

27 Claims, 9 Drawing Sheets

METHOD AND APPARATUS FOR TESTING SEMICONDUCTOR INTEGRATED CIRCUITS

BACKGROUND OF THE INVENTION

1. Field of the Invention

The present invention relates to a testing method and a testing apparatus for semiconductor integrated circuits including a CMOS circuit.

2. Description of the Related Art

A CMOS is composed of a combination in series of P channel and N channel metal oxide semiconductor (MOS) transistors. Because of complementary nature of P channel and N channel (Pch, Nch, respectively), no current other than leak current flows in a stationary state, and power consumption is extremely small. Accordingly, when the CMOS is integrated at a high density as a semiconductor integrated circuit, heat generation can be minimized, and it is used widely in large scale integrated circuits. In the CMOS LSI which is a large scale integrated circuit containing a CMOS, $I_{DDQ}$ test is conducted as a part of judgement of quality. The CMOS LSI is characterized in that only when the internal state of the CMOS makes a transmission, both MOS transistors (Pch and Nch) are turned on and a power source current flows in a pulse form, while the CMOS reaches a static state, the power source current becomes almost zero. The power source current in the static state is called "$I_{DDQ}$". Since large $I_{DDQ}$ flows if there are any defects inside the LSI, the presence or absence of defects can be detected by measuring the $I_{DDQ}$. In such $I_{DDQ}$ test, by varying the internal state while supplying a test pattern to the LSI, it is required to measure the power source current only when the state is stabilized, that is, in a static state.

The prior art for measuring the power source current in the static state includes, for example, Japanese Laid-open Patent 5-273298 and Japanese Laid-open Patent 6-58981. In Japanese Laid-open Patent 5-273298, a measuring circuit is composed outside the CMOS semiconductor integrated circuit, and is built in the same semiconductor substrate, whereas in Japanese Laid-open Patent 6-58981, the measuring circuit is built in the CMOS integrated circuit itself. The principle of measurement, however, is common in that a resistance for detecting a current is inserted in a power source line, and a potential difference occurring at both ends is measured to be compared sequentially with a limit value by a comparator.

In the CMOS LSI, while the $I_{DDQ}$ is usually nearly zero, it does not become zero if there is any abnormality, so that a defective device can be detected by measuring the $I_{DDQ}$. The limit value for the quality judging test is determined depending on the $I_{DDQ}$ current value of a non-defective device, and does not depend on the power source current value at the state transition time of CMOS. Therefore, the resistance for detecting power source current used for the purpose of the $I_{DDQ}$ test requires a higher resistance as the $I_{DDQ}$ current of the non-defective device becomes smaller. When the current detecting resistance is a high resistance, the time constant which is a product with the floating capacity of the current detecting resistance becomes large, it takes a longer time until the current due to the state transition settles in a static state, and one test needs about scores of microseconds to several microseconds. Measurement of $I_{DD}Q$ is required every time the internal state of the CMOS integrated circuit changes. A large scale integrated circuit such as LSI may require measurements of thousands to hundreds of thousands of times. If one measurement of $I_{DDQ}$ takes a long time, the entire $I_{DDQ}$ test requires a very long time, which makes a high-speed test difficult to accomplish.

Also, since it is necessary to judge the quality in real time after the state has been stabilized by applying a test pattern, it always requires a test pattern for the purpose of measuring the $I_{DDQ}$, aside from the test patterns for function tests of the integrated circuit. Moreover, owing to the principle of $I_{DDQ}$ test, in the event of malfunction caused at specific timings, abnormality does not appear in a static state where current is measured, and it is difficult to detect defects in operation and function as a LSI.

SUMMARY OF THE INVENTION

It is an object of the present invention to provide a method and apparatus for testing a semiconductor integrated circuit capable of judging the quality of the semiconductor integrated circuit including a CMOS circuit during a short period, without having to directly measure a feeble power source current in a static state.

The invention provides a testing method of a semiconductor integrated circuit characterized by counting the number of pulse signals exceeding a predetermined reference level contained in the power source current of the semiconductor integrated circuit while applying a test pattern composed of plural predetermined patterns to the semiconductor integrated circuit containing a CMOS, and comparing the count with an expected value calculated preliminarily according to the test pattern sequentially in real time, every time the state changes after application of each pattern.

According to the invention, when a test pattern composed of plural predetermined patterns is supplied to the semiconductor integrated circuit containing a CMOS, a transient current in a pulse form flows in the power source current when the internal state of the CMOS makes a transition. When the CMOS circuit is non-defective, the number of times of state transition can be calculated preliminarily depending on the pattern. Every time state of each pattern changes, by comparing the count of the state transition pulses with an expected value calculated preliminarily, the quality judgement can be made. It is sufficient to detect the pulse form changes in the power source current occurring at the time of state transition of CMOS, and it is not necessary to wait until the current change due to state transition settles at the current in a static state, so that testing can be done at a high speed.

The invention also provides a testing method of a semiconductor integrated circuit characterized by counting the number of pulse signals exceeding a predetermined reference level contained in the power source current of the semiconductor integrated circuit while applying a test pattern composed of plural predetermined patterns to the semiconductor integrated circuit containing a CMOS, and comparing the final count after application of the test pattern with an expected value calculated preliminarily according to the test pattern.

According to the invention, when a test pattern is applied to the semiconductor integrated circuit containing a CMOS, a transient current in a pulse form flows in the power source current at the time of state transition of the CMOS circuit. Since the test pattern is predetermined in a non-defective CMOS circuit, the number of times of the state transition can be calculated correspondingly. By comparing the expected value and the final count value of the state transition pulses, the quality of the semiconductor integrated circuit can be judged. For measurement of state transition pulses of the test pattern, it is not necessary to wait until the transition state is stabilized, and the testing time can be shortened and the quality can be judged at a high speed.

It is a feature of the invention to count the number of pulse signals in the power source current by inserting a resistance for detecting the power source current in the power source current supply path, converting the level of the potential difference at both ends, and feeding the conversion into the counter.

According to the invention, the number of pulse signals in the power source current is counted by inserting a resistance for detecting the power source current in the power source current supply path, and converting the level of the potential difference at both ends. Since the object of detection is the current in a pulse form at the time of state transition of the CMOS circuit, it is not required to detect a feeble current as needed in the $I_{DDQ}$ test for measuring the feeble current in a static state, and therefore the resistance value of the resistance for detecting the power source current may be small. The measuring time and the time required for the entire test can be substantially shortened.

Moreover, the invention provides a testing apparatus for a semiconductor integrated circuit comprising:

pattern generating means for generating a test pattern composed of plural predetermined patterns and feeding the pattern into a semiconductor integrated circuit containing a CMOS;

means for detecting a power source current of the semiconductor integrated circuit;

means for counting changes of pulses exceeding a predetermined reference level of the power source current detected by the detecting means; and means for comparing the count by the counting means with an expected value preliminarily calculated according to the test pattern generated by the pattern generating means.

According to the invention, by the use of the test pattern composed of plural predetermined patterns generated by the pattern generating means and fed into the semiconductor integrated circuit containing CMOS, the detecting means detects current changes in a pulse form caused by state transition of the CMOS. When the pulse form current change exceeds a predetermined reference level, it is detected by the counting means, and the count by the counting means is compared by the comparing means with the expected value preliminarily calculated corresponding to the test pattern generated by the pattern generating means, so that the quality can be judged. By comparing with the count value, the purpose of quality judgement can be achieved without an analog comparator of high precision for comparing the feeble current, or without a memory for storing changes of the power source current due to the test pattern. The detecting means detects only the pulse form changes of the power source current, and it is not necessary to wait until the CMOS is stabilized in the static state changing from the transition state, so that the measuring time can be shortened. It is also possible to detect timing troubles or the like which shows the state transition different from normal conditions due to the timing such as a signal delay.

The detecting means of the invention has a resistance for detection inserted in a power source current path, and leads out a signal converting the level of the potential difference at both ends of the resistance for detection.

The counting means comprises a latch circuit which is reset when each pattern of the test pattern is generated from the pattern generating means, and which is set when a signal sent out from the detecting means exceeds a predetermined reference level, and a counter for counting the number of times of state transition between the reset state and the set state of the latch circuit.

According to the invention, when each pattern of the test pattern is generated from the pattern generating circuit, the latch circuit is reset, and the latch circuit is set by the level-converted signal of the potential difference at both ends of the resistance for detection which is inserted in the power source current flowing path. The number of times of state transition between the reset state and the set state of the latch circuit is counted by the counter, so that the number of times of state transition of the CMOS can be counted securely. In the CMOS, since a transient current with larger pulses flows at the time of state transition than in the static state, the measuring time can be shortened by reducing the resistance value of the resistance for detection.

Thus, according to the invention, the quality can be judged by confirming the presence or absence of the state transition of the CMOS sequentially in real time at every state change after applying each pattern of the test pattern. It is sufficient to securely detect the state change accompanied by each pattern, it is not necessary to wait until the transition state settles in a static state, and the test time can be shortened. Moreover, by judging the quality in each pattern, if judged defective in an initial pattern of test pattern, testing of the semiconductor integrated circuit being tested can be suspended, and the test time can be shortened. Furthermore, since quality Judgement is made with each pattern, data contributing to the analysis of cause of defects may be also provided.

Also, according to the invention, by accumulating the count values of the pulses of power source current corresponding to the state transition of each pattern of the test patterns, the final count after application of the entire test pattern is compared with the expected value calculated preliminarily corresponding to the test pattern to Judge the quality, so that the quality may be judged at a high speed and with ease.

According to the invention, since the resistance value of a resistance for detecting the power source current inserted in the power source current detecting circuit can be reduced, the time constant is decreased, and therefore, the measuring time of the pulse form current changes due to state transition and the required time of the entire test can be significantly shortened.

Although a high-speed comparator and a test pattern memory for storing comparative data are needed in the conventional $I_{DDQ}$ current judgement, the invention enables to judge without using them, and the price of the test apparatus can be reduced. In addition, timing defects can be also detected, and the test time can be shortened.

Also in the invention, as compared with the conventional $I_{DDQ}$ test, the resistance value of a resistance for detecting the power source current can be reduced, the measuring time is shortened, the test cost is reduced, and the throughput of the test can be improved.

In the prior art, Japanese Laid-open Patent Hei 5-273298 and Japanese Laid-open Patent Hei 6-58981, by measuring the potential difference at both ends of the resistance for detection, it is compared with the limit value for judging the feeble power source current in a static state, whereas the invention is intended to count the pulses of the power source current, and to compare the value with the judging value. Hence, the following advantages are brought about:

I. It is not necessary to measure the feeble current, and the resistance value for detection of power source current can be set smaller than in the prior art. Accordingly, the time constant of the measuring system is smaller, and the test time can be shortened.

II. An open trouble which is difficult to detect in the prior art can be detected, and the shipping quality can be improved.

III. A high speed comparator for comparative judgment is needed in the prior art, but it is not absolutely necessary in the invention, so that the inspection apparatus can be formed inexpensively.

BRIEF DESCRIPTION OF THE DRAWINGS

Other and further objects, features, and advantages of the invention will be more explicit from the following detailed description taken with reference level to the drawings wherein.

DETAILED DESCRIPTION OF THE PREFERRED EMBODIMENTS

Figure 1:
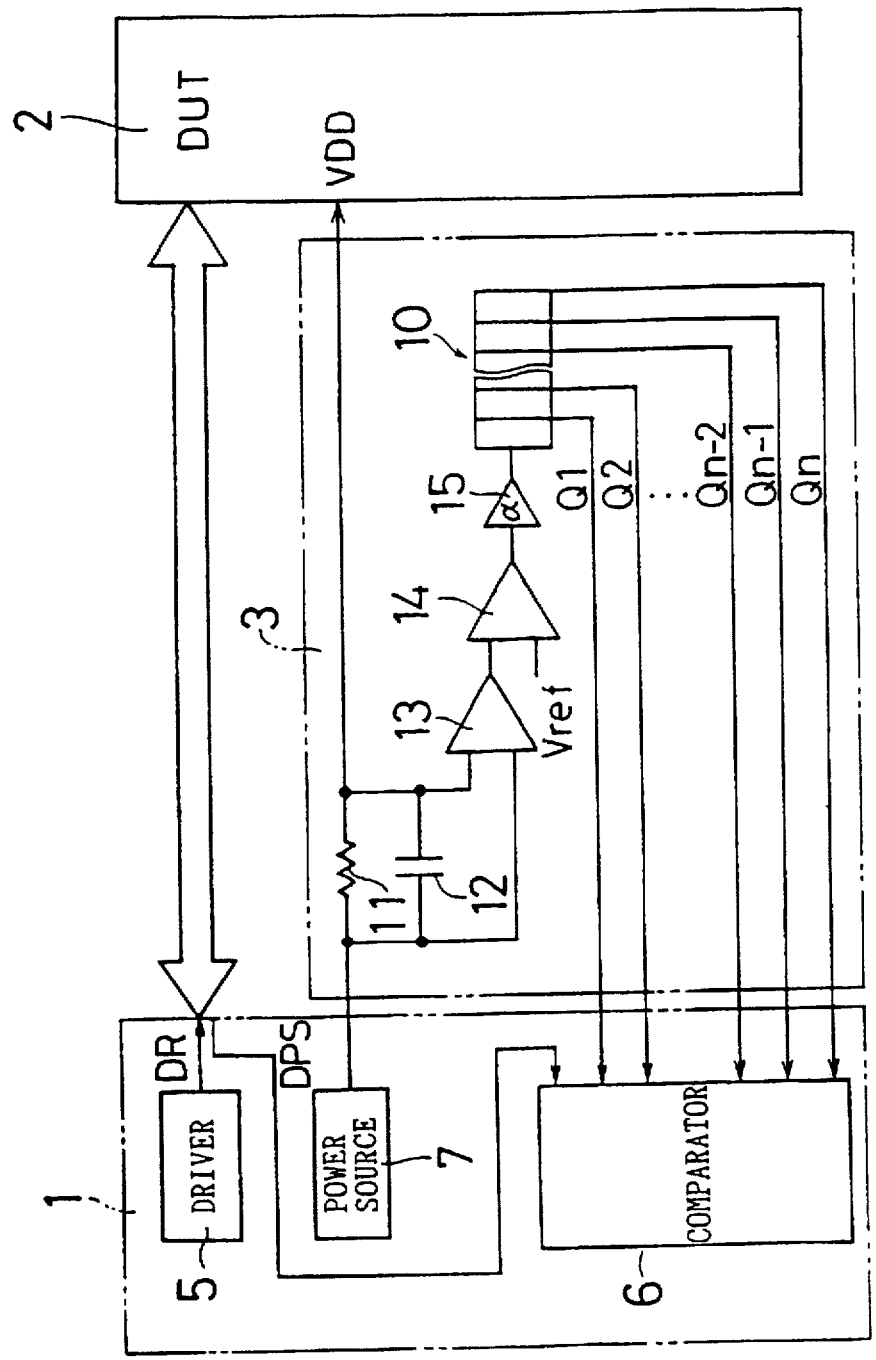
FIG. 1 is a block diagram showing a schematic electrical configuration of a first embodiment of the invention.

Now referring to the drawings, preferred embodiments of the invention are described below.

FIG. 1 shows a schematic electrical configuration of a first embodiment of the invention. A general-purpose testing apparatus 1 applies a test pattern to a semiconductor integrated circuit to be tested (hereinafter referred to as "DUT", which represents a device under test). An adapter 3 is inserted somewhere in the feeding path of the power source current to be supplied to the DUT. The testing apparatus 1 comprises a driver (hereinafter may be referred to as "DR") 5 for applying a test pattern to the DUT 2, a comparator (hereinafter may be referred to as "CMP") 6 for receiving a signal usually from the DUT 2 and converting it into a logic value, and a device power source (hereinafter may be referred to as "DPS") 7 for supplying the DUT with power source current for operation. The adapter 3 can be incorporated in the testing apparatus 1, or may be also built in the DUT 2.

The adapter 3 contains a counter 10 for counting the number of times of pulse form changes of the power source current corresponding to the detected state transition. The power source current is detected by a current detecting resistance 11 which is inserted in a power source feed line linking the power source 7 and a supply voltage terminal (VDD) in the DUT 2. At both ends of the current detecting resistance 11, a phase compensating capacitor 12 is connected, and the potential difference between the both ends is amplified by a differential amplifier 13, and is outputted as a grounding (GND) potential reference level. The output of the differential amplifier 13 is compared with a preset judging level (Vref) by a comparator 14. This comparison output is amplified a times by an amplifier 15, and is fed into a counter 10 as the signal for counting. By presetting the test pattern supplied from the driver 5 to the DUT 2, when the DUT 2 is normal, the number of times of state transition of the CMOS circuit portion in the DUT 2 and the transition timing can be predicted, and the count value of the counter 10 can be compared with the expected value calculated preliminarily corresponding to the test pattern. When the count of the counter 10 and the expected value do not coincide, it is judged that a defect is present in the CMOS circuit portion in the DUT 2 or the like.

Figure 2:
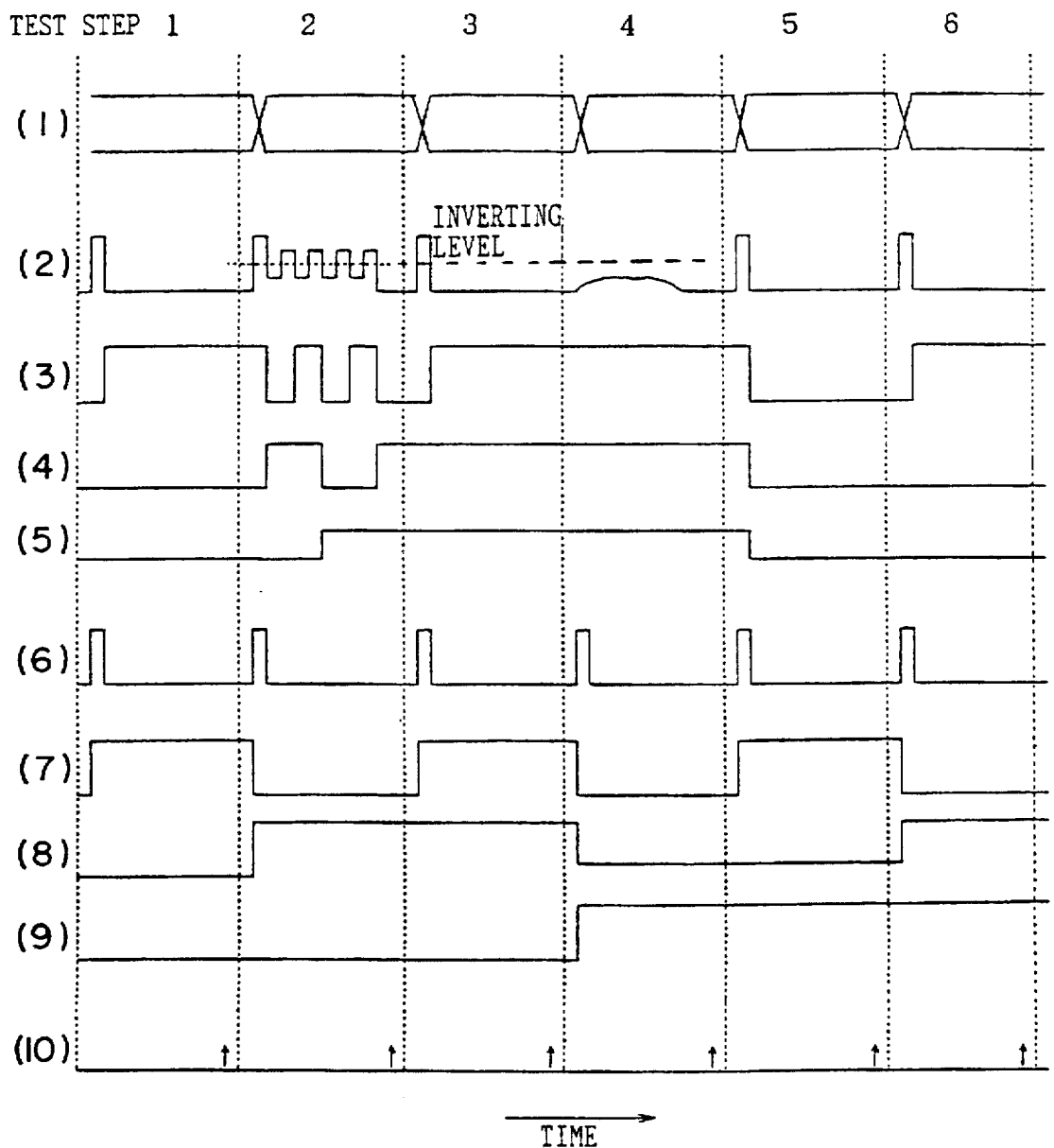
FIG. 2 is a time chart showing the operation of the configuration of FIG. 1.
Figure 7:
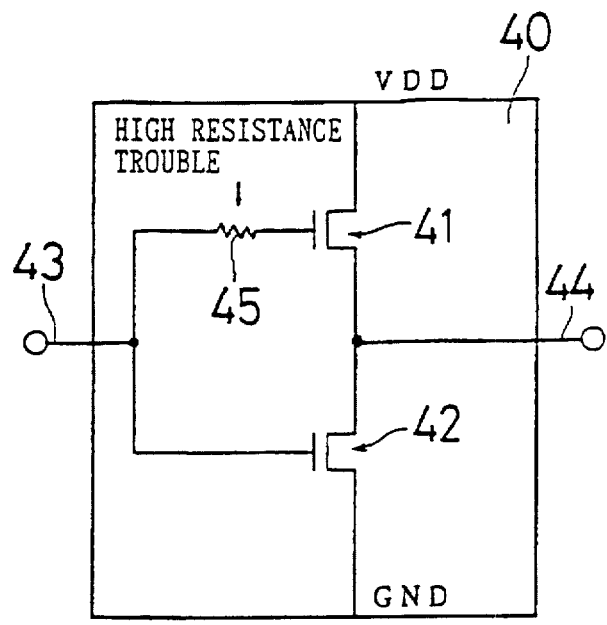
FIG. 7 is a simplified electric circuit diagram showing an example of trouble that can be detected in the embodiments in FIG. 1 and FIG. 5.
Figure 9:
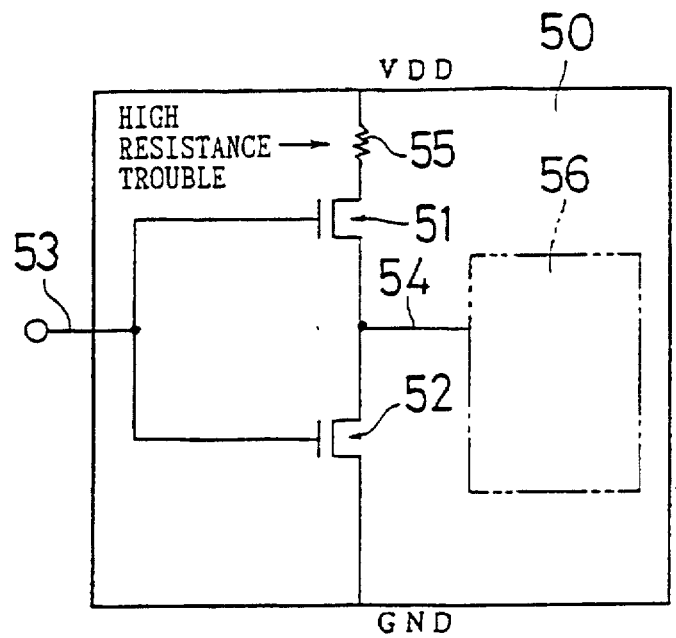
FIG. 9 is a simplified electric circuit diagram showing an example of trouble that can be detected in the embodiments in FIG. 1 and FIG. 5.

FIG. 2 shows an example of signal waveform of parts of the configuration in FIG. 1. In this case, it is explained by supposing that there is a state change in every test step and that a power source current in a pulse form flows. Each step of the counter 10 is designed to count at the trailing edge of a clock signal to be inputted. The comparator 6 of the testing apparatus 1 is designed to test all test output signals Q1 to Qn at each step of the counter 10, but only Q1 to Q3 are shown in FIG. 2 for the convenience of explanation. FIG. 2 (1) shows the input signal supplied to the DUT 2. FIG. 2 (2) shows the output signal fed into the counter 10. At test step 2, a defect shown in FIG. 9 is indicated, and at step 4, a defect shown in FIG. 7 is indicated. FIG. 2 (3), (4), and (5) show output signals Q1, Q2, Q3 of the counter 10, respectively. FIG. 2 (6), (7), (8), and (9) show the input signal of the counter 10 in the absence of defects in the DUT 2 as well as output signals Q1 to Q3 of the counter 10. FIG. 2 (10) shows a strobe point which is the test timing of the comparator 6 conducted in the later part of each test step.

The following Table 1 shows the state of the counter 10 after test step 6 with respect to the output signals Q1 to Q3. By comparing the state of the output signals Q1 to Q3 after the completion of all test steps with the expected value, the quality of DUT 2 can be judged without using a high speed comparator or test pattern memory. In the example in FIG. 2, in the state after test step 6, there is a difference between the defect state and the non-defect state even in consideration of the output signals Q1 to Q3 only. Therefore, each output state can be tested in terms of DC. Prior to start of test step 1, it is necessary to reset the output of each step of the counter 10 to zero.

TABLE 1

| State of counter 10 after step 6 | With defect | Without defect |
|---|---|---|
| Q1 | 1 | 0 |
| Q2 | 0 | 1 |
| Q3 | 0 | 1 |

Figure 3:
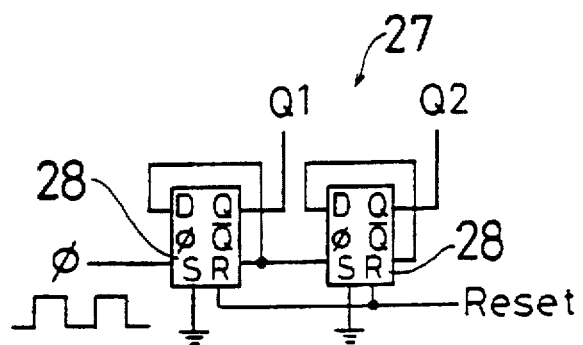
FIG. 3 is a block diagram and time chart showing a specific configuration of a counter in the embodiment in FIG. 1.
Figure 3:
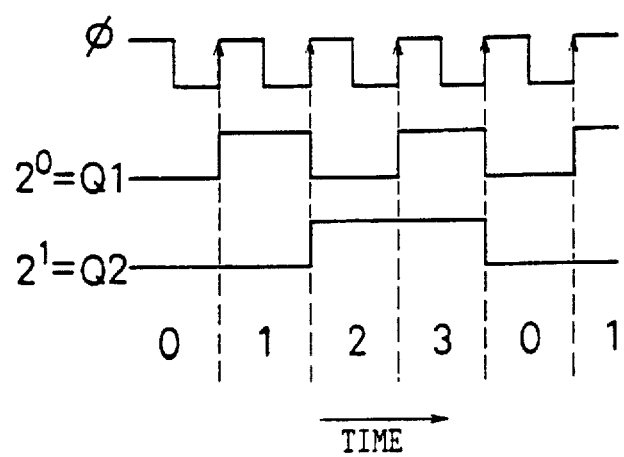
Figure 4:
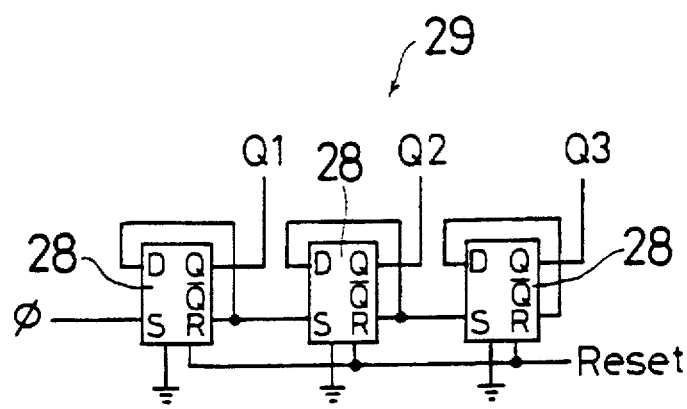
FIG. 4 is a block diagram and time chart showing a specific configuration of the counter in the embodiment in FIG. 1.
Figure 4:
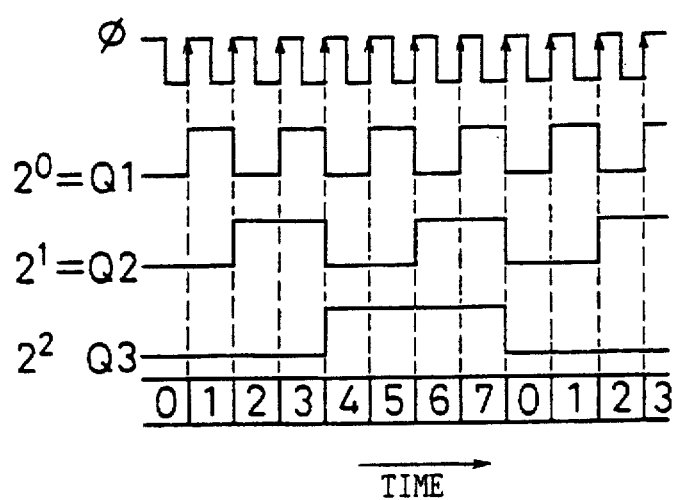

FIG. 3 and FIG. 4 show specific configuration of the counter 10 in FIG. 1. FIG. 3 relates to a two-bit counter 27. Using a two-stage flip-flop (hereinafter referred to as "F/F")

28, a binary counter of quaternary notation is composed. In FIG. 4, using the F/F 28 in three stages, a three-bit counter 29 is composed, and a binary counter of octal notation is formed. In the two-bit counter 27 and three-bit counter 29, all outputs are once set to zero in response to a reset signal, and the number of pulses of the clock is counted depending on the leading edge of the clock signal ($\phi$). As the F/F 28, for example, 4013 or its equivalent among standard CMOS logic ICs may be used.

Figure 5:
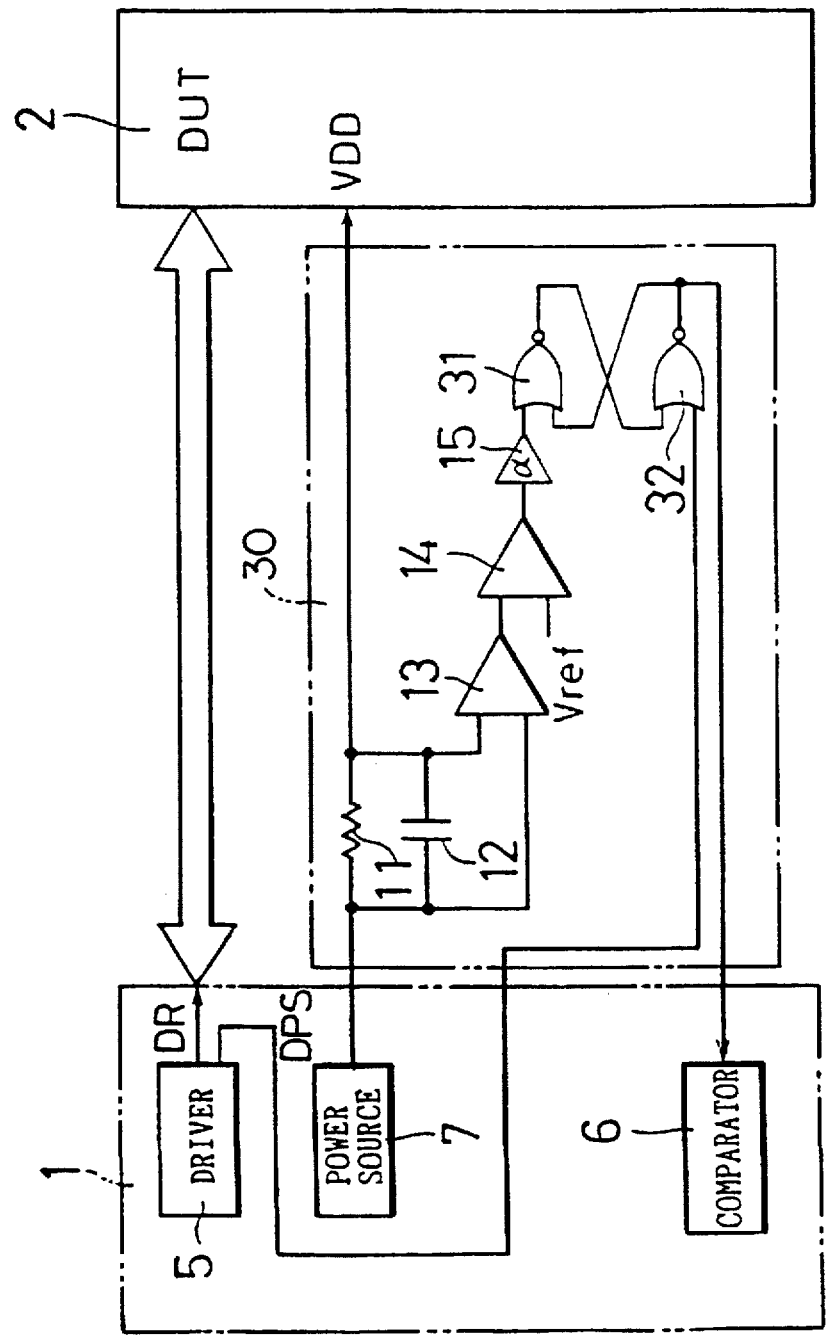
FIG. 5 is a block diagram showing a schematic electrical configuration of a second embodiment of the invention.

FIG. 5 shows a schematic electrical configuration of a second embodiment of the invention. In this embodiment, the elements corresponding to those of the first embodiment are identified with same reference level numerals, and their explanation is omitted. In an adapter 30 of this embodiment, a latch circuit composed of NOR gates 31, 32 is included. The latch circuit formed by the NOR gates 31, 32 stores the presence or absence of the state transition of the DUT 2.

Figure 6:
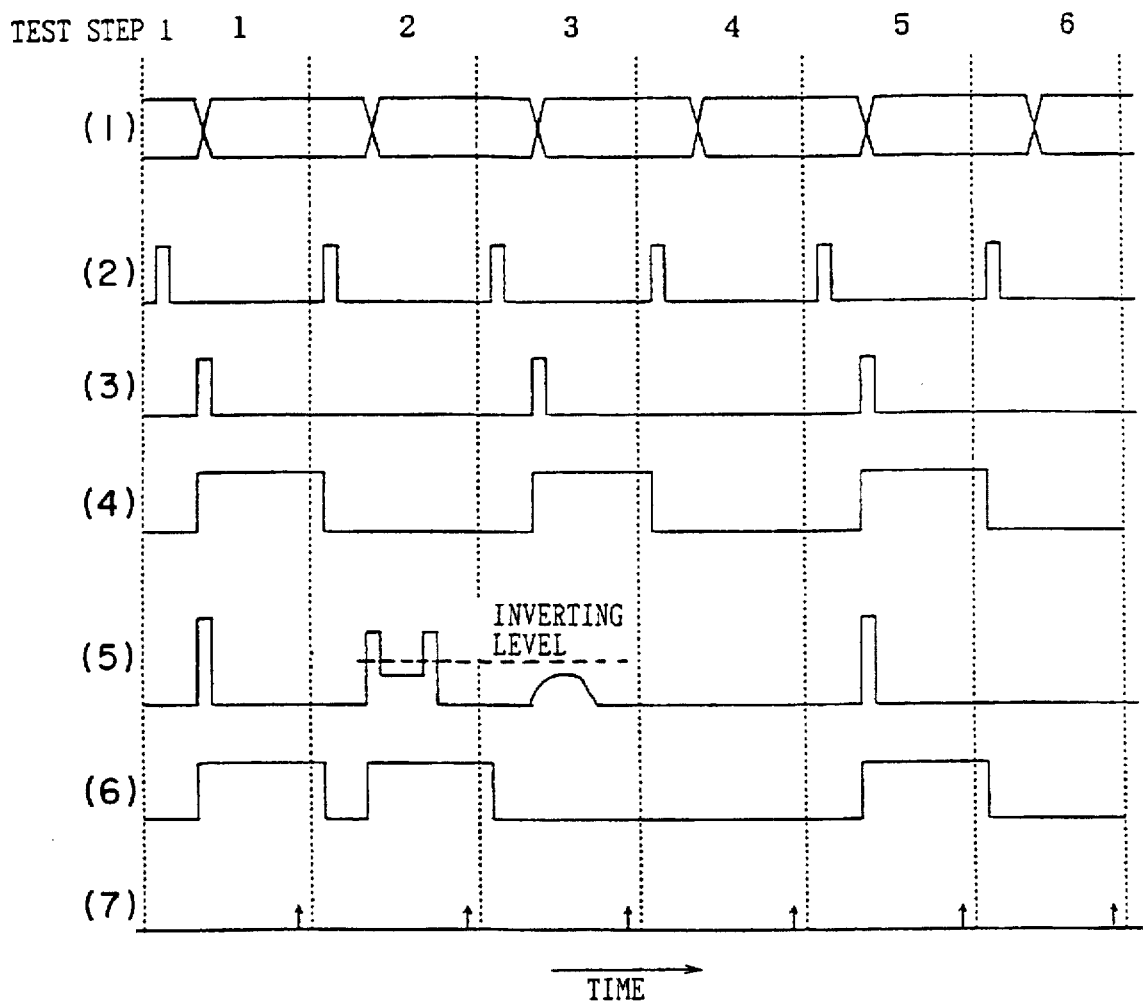
FIG. 6 is a time chart showing the operation of the configuration of FIG. 5.

FIG. 6 shows the operation of the configuration of FIG. 5. In this embodiment, it is supposed that the state change occurs in every odd-number test step to cause pulse form changes of the power source current caused by the state transition. FIG. 6 (1) shows a signal supplied from the driver 5 to the DUT 2. FIG. 6 (2) shows a reset input signal supplied to the NOR gate 32 of the latch circuit. FIG. 6 (3) shows a set input signal supplied to the NOR gate 31. FIG. 6 (4) shows a waveform of the output signal from the latch circuit in the absence of defects. FIG. 6 (5) shows a set input signal of the latch circuit in the presence of defects. FIG. 6 (6) shows an output signal from the latch circuit in the presence of defects. When the DUT 2 contains a defect, the input signal of the latch circuit is supposed to contain reset input signals corresponding to the defects in FIG. 9 and FIG. 7 (which will be described later) at test step 2 and test step 3. Comparing FIG. 6 (4) and FIG. 6 (6), the difference in the count values due to the presence or absence of defects can be distinguished. At the test timing of strobe points as shown in FIG. 6 (7), by sequentially comparing with the expected value of one bit at every test step, the presence or absence of a power source current pulse, that is, the presence or absence of the state transition can be confirmed, and the quality can be judged. As the latch circuit, the NOR gates 31, 32 are used; however, by using a NAND gate or the like, the latch circuit having reset signal and set signal input terminals can be realized.

In the embodiments in FIG. 1 and FIG. 5, measurement of any feeble power source current in the static state of the DUT 2 is not necessary for quality judgement, and it is sufficient to detect the pulse form changes in the power source current. Therefore, when the power source current in transition is 1000 times the power source current in the static state, the resistance value of the current detecting resistance 11 can be 1/1000. The time required for measurement which is rate-determined by the time constant determined by the resistance value of the current detecting resistance 11 is reduced to 1/1000.

FIG. 7 shows an example of a CMOS inverter 40. In the CMOS inverter 40, a Pch MOS FET 41 and a Nch MOS FET 42 are contained, and an input terminal 43 and an output terminal 44 are provided. The input terminal 43 is externally led out as respective gate electrodes of the Pch MOS FET 41 and Nch MOS FET 42 are connected commonly thereto. The output terminal 44 is externally led out as the drains of the Pch MOS FET 41 and Nch MOS FET 42 are connected commonly thereto. Between the input terminal 43 of this CMOS inverter 40 and Pch MOS FET 41, a high resistance 45 which otherwise is not required is formed due to a defect such as a wiring pattern, and a high resistance trouble occurs.

Figure 8:
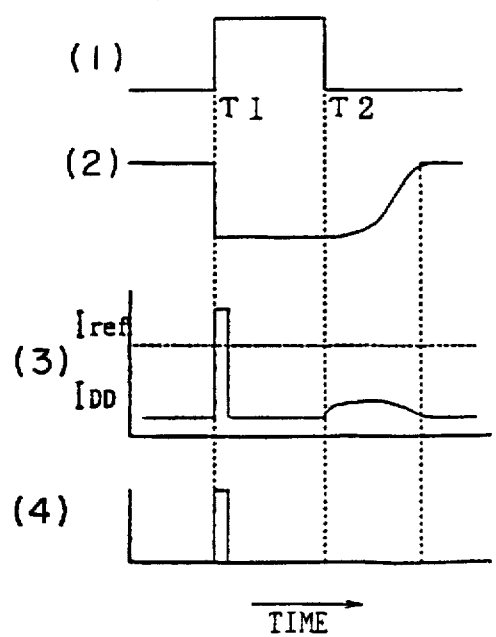
FIG. 8 is a time chart showing the trouble detecting state in FIG. 7.

FIG. 8 shows changes of the current $I_{DD}$ from the power source VDD corresponding to the operation of the CMOS inverter 40 in FIG. 7. As shown in FIG. 8 (1), when a pattern signal is fed into the input terminal 43, a signal is obtained from the output terminal 44 as shown in FIG. 8 (2). At time T1, since the output state of the output terminal 44 changes from a high level to a low level, a pulse form change of the power source current $I_{DD}$ exceeding the judging level Iref occurs as shown in FIG. 8 (3). In response thereto, as shown in FIG. 8 (4), $I_{DD}$ pulse is obtained as an input waveform to the counter. At time T2, due to the high resistance 45, the change of $I_{DD}$ becomes smaller. Hence, being $I_{DD}$<Iref, the $I_{DD}$ pulse for counter input remains at a low level. In the embodiments in FIG. 1 and FIG. 5, by converting Iref to the voltage judging level Vref, the voltages are compared by the comparator 14, but the operating principle is the same as in FIG. 8 (3).

Normally, at the timing of T1 and T2, pulses of the power source current $I_{DD}$ are generated, but at timing T2, since the gate input signal to the Pch MOS FET 41 is delayed by the high resistance 45, even when the Nch MOS FET 42 is changed from ON state to OFF state, the Pch MOS FET 41 is not turned on and still retains a high resistance value. Although the Pch MOS FET 41 gradually becomes ON state, and finally the level of the output terminal 44 becomes a high level to be stabilized, the Pch MOS FET 41 and Nch MOS FET 42 are not turned on simultaneously, so that a pulse form transient current does not flow in the power source current. Since the transient current pulse to be generated at one timing is missing, the presence of defects in the CMOS inverter 40 can be detected. In the conventional $I_{DDQ}$ test, even in such CMOS inverter 40, the power source current in the static state is almost zero, and hence trouble cannot be detected.

FIG. 9 shows another example of a CMOS inverter 50 including a defect. The CMOS inverter 50 has a fundamental structure of an inverter to which a Pch MOS FET 51 and a Nch MOS FET 52 are connected in series, where an input signal is supplied to an input terminal 53, and an output is led out from an output terminal 54. A trouble occurs in that a high resistance 55 has been inserted between the Pch MOS FET 51 and the power source VDD, and another logic circuit 56 is connected to the output terminal 54. Such high resistance 55 is produced by a problem in the manufacturing process or the like.

Figure 10:
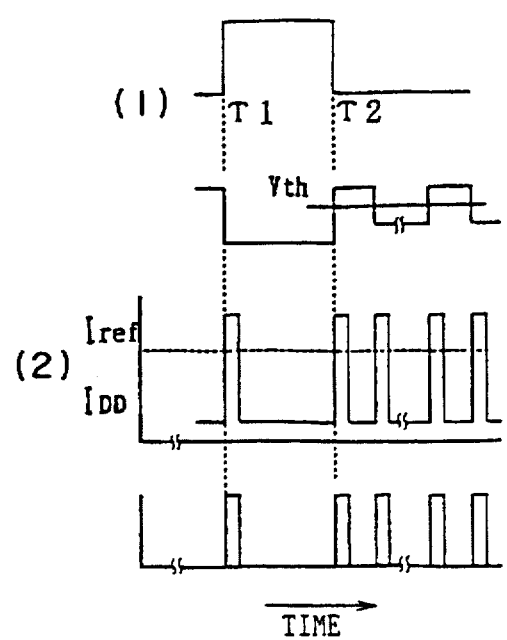
FIG. 10 is a time chart showing the trouble detecting state in FIG. 7.

FIG. 10 shows the operating state in the testing of the CMOS inverter 50 in FIG. 9. As shown in FIG. 10 (1), a test pattern is applied to the input terminal 53. At timing T1, it is changed from a low level to a high level, and at timing T2, a high level to a low level. Normally, a pulse of $I_{DD}$ is generated at the timing of T1 and T2, during which a power source current pulse is not generated. However, when the input voltage becomes a low level, if the Pch MOS FET 51 is turned on, the output terminal 54 is kept in a floating state because of the high resistance 45, irregular changes occur in the upper and lower levels of the input inverting level Vth of the logic circuit 56 at the next stage, and a power source current pulse is generated on every occasion. Since the number of pulses increases as compared with the state of a non-defective device, by monitoring the output of the counter 10 in FIG. 1, the presence of any defect in the Pch MOS FET 51 can be detected. In the conventional $I_{DDQ}$ test, since there is no function for accumulating the history of irregular changes of the output terminal 54, it is extremely difficult to detect such a trouble.

By setting the resistance value of the current detecting resistance 11 shown in FIG. 1 and FIG. 5 and the power source current pulse judging level Iref to be equal to those in the case of an $I_{DDQ}$ test, an equivalent test as in the conventional $I_{DDQ}$ test may be conducted. In this case, however, the required test time is the same as in the conventional $I_{DDQ}$ test.

Figure 11:
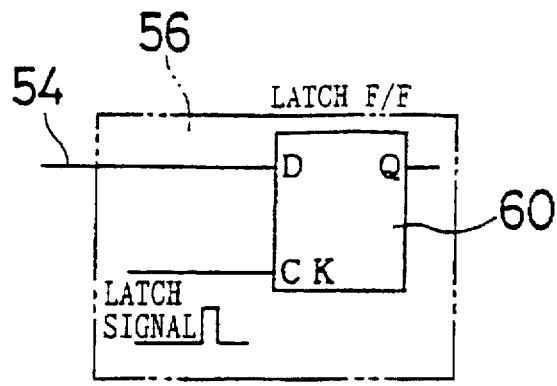
FIG. 11 is a simplified block diagram showing F/F for latch contained in a logic circuit 56 in FIG. 9.
Figure 12:
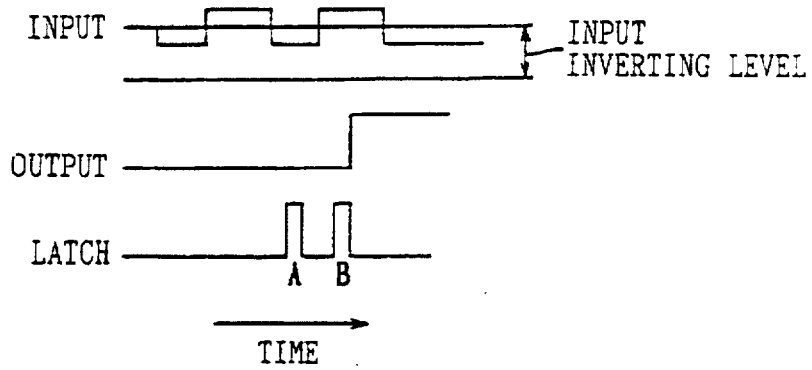
FIG. 12 is a time chart showing the operating state of the F/F for latch in FIG. 11.
Figure 13:
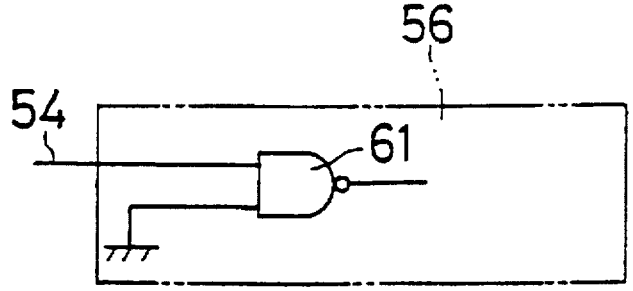
FIG. 13 is a simplified block diagram showing the configuration in which a NAND gate is included in the logic circuit 56 in FIG. 9.

As shown in the later part in FIG. 10 (2), if the output terminal 54 in FIG. 9 is set in a floating state and its level is uncertain, where a data latch circuit as shown in FIG. 11 is contained in the logic circuit 56 in FIG. 9, and the output from the output terminal 54 is a data signal to the data latch circuit, the data may be latched normally in spite of the trouble of the formation of the high resistance 55. In the simple function test, such trouble cannot be always detected. This is because, depending on the timing of the clock fed to a latch F/F 60, it may be regarded as normal data. More specifically, as shown in FIG. 12 (1), when the output level from the output terminal 54 fluctuates near the input inverting level, at the latch timing A of the latch signal CK supplied as clock, a low level is conveyed to the output to cause malfunction, whereas at the latch timing B, a high level is conveyed to the output for normal operation, and thus the change of output level may be judged as malfunction also in the control depending on the latch timing. Moreover, as shown in FIG. 13, an input NAND gate 61 is contained in the logic circuit 56 in FIG. 9, and when the output terminal 54 is connected to this input, if the input levels of other input terminals are low level only, a trouble signal is not conveyed to the output of the NAND gate 61 in the function test pattern, so that a trouble cannot be detected. Therefore, if both $I_{DDQ}$ test and function test are executed, such trouble as shown in FIG. 9 may be overlooked. According to the embodiment in FIG. 1, since the predetermined expected value is compared with the count value, the trouble as shown in FIG. 9 may be easily detected by using the same test pattern as in the function test.

The trouble of the formation of the high resistance 45 as shown in FIG. 7 occurs, for example, when an aluminum wiring in the semiconductor integrated circuit becomes very thin. In such a case, even if the operation itself is normal, it is highly likely that the wiring may be broken in a short time due to an electromigration phenomenon. Thus, it will be necessary to detect such defect before a shipping stage and to judge and remove the semiconductor integrated circuit as a defective device. In the conventional function test or $I_{DD}Q$ test, such trouble cannot be detected; however, it can be easily detected in the embodiment in FIG. 1 or FIG. 5.

Thus, according to the embodiments, although a CMOS LSI is used as the DUT 2, testing can be similarly conducted in a CMOS standard logic integrated circuit of smaller scale, an integrated circuit containing a gate array, or an analog circuit. Moreover, even in a so-called BiCMOS integrated circuit containing a bipolar circuit, the pulse form change of the power source current due to the state transition of the CMOS circuit portion can be detected easily, so that the CMOS circuit portions can be tested similarly.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A method of testing a semiconductor integrated circuit for defects, the method comprising the steps of:
   supplying a power source current to the semiconductor integrated circuit;
   applying a test signal pattern to the semiconductor integrated circuit;
   counting pulses contained in the supplied power source current of the semiconductor integrated circuit, which pulses exceed a predetermined reference current level, while applying the test signal pattern to the semiconductor integrated circuit; and
   comparing the count with a predetermined expected value to determine whether the semiconductor integrated circuit is defective.

2. The method according to claim 1, wherein the applied test signal pattern includes a plurality of predetermined patterns, and every time the state changes after application of each pattern, the count is sequentially in real time compared with an expected value calculated preliminarily according to the test signal pattern.

3. The method according to claim 1, wherein after application of the test signal pattern, the final count of the pulses is compared with an expected value calculated preliminarily according to the test pattern.

4. The method according to claim 2, wherein the counting step is performed using a resistance for detecting the power source current in a power source current supply path, whereby the potential difference across the resistance is compared to a reference voltage and converted to a voltage pulse when the reference voltage is exceeded, the voltage pulse being fed into a counter.

5. The method according to claim 3, wherein the counting step is performed using a resistance for detecting the power source current in a power source current supply path, whereby the potential difference across the resistance is compared to a reference voltage and converted to a voltage pulse when the reference voltage is exceeded, the voltage pulse being fed into a counter.

6. A testing apparatus for determining whether a semiconductor integrated circuit is defective, the apparatus comprising:
   pattern generating means for generating a test pattern and feeding said test pattern into an input of the semiconductor integrated circuit;
   detecting means for detecting a power source current of the semiconductor integrated circuit and producing a pulse when the power source current exceeds a predetermined current level;
   counting means for counting said pulses produced by said detecting means; and
   comparing means for comparing the count obtained by said counting means with an expected count value based upon said test pattern generated by said pattern generating means.

7. The testing apparatus according to claim 6, wherein said detecting means includes a resistance external to the semiconductor integrated circuit being tested, said resistance being in a power source current path, said detecting means detecting the power source current by detecting the potential difference across said resistance.

8. The testing apparatus according to claim 7, wherein said test pattern includes a plurality of predetermined patterns, and said counting means includes a latch circuit which is reset when each pattern of said test pattern is generated and which is set when a signal sent out for said detecting means exceeds a predetermined reference level, as well as a counter for counting a number of times of the state transition between the reset state and the set state of said latch circuit.

9. The testing apparatus according to claim 6, wherein the semiconductor integrated circuit is part of said apparatus and is a CMOS inverter.

10. The method according to claim 4, wherein the resistance is external to the semiconductor integrated circuit.

11. The method according to claim 5, wherein the resistance is external to the semiconductor integrated circuit.

12. The method according to claim 1, wherein the comparing step uses a three-bit binary counter.

13. The method according to claim 1, wherein the tested semiconductor integrated circuit is indicated as defective when the count is greater than the predetermined expected value.

14. The method according to claim 1, wherein the tested semiconductor integrated circuit is a CMOS device.

15. A method for monitoring the operation of a semiconductor integrated circuit, comprising the steps of:

(a) supplying power source current to a power input terminal of the semiconductor integrated circuit;

(b) detecting a number of times that the power source current supplied in said step (a) exceeds a predetermined current level; and (c) comparing the number detected in said step (b) against a predetermined number, a result of said comparing indicating whether the semiconductor integrated circuit is operating defectively.

16. The method according to claim 15, wherein said step (a) is performed concurrently with the step of:

(d) supplying a signal pattern to an input terminal of the semiconductor integrated circuit.

17. The method according to claim 16, wherein the signal pattern of said step (d) is a test signal pattern for testing whether the semiconductor integrated circuit is defective, and the predetermined number in said step (c) is based upon the test signal pattern.

18. The method according to claim 15, wherein said step (b) includes the substeps of:

(b-1) detecting a voltage across a resistance external to the semiconductor integrated circuit, the voltage being generated by the power source current; and (b-2) producing a pulse when the detected voltage exceeds a predetermined voltage level; and (b-3) counting the number of pulses produced in said substep (b-2).

19. The method according to claim 18, wherein the resistance is connected in series with the power input terminal of the semiconductor integrated circuit such that all of the power source current passes through the resistance.

20. The method according to claim 15, wherein the semiconductor integrated circuit is a CMOS inverter including a P-channel transistor having a source, and the power input terminal is connected to the source of the P-channel transistor, the power input terminal for receiving a positive voltage.

21. An apparatus for monitoring the operation of a semiconductor integrated circuit having a power input terminal for receiving power source current, said apparatus comprising:

a current to voltage converter for detecting a current supplied to the power input terminal of the semiconductor integrated circuit and for producing a voltage pulse when the detected current exceeds a predetermined current level;

a counter for counting the number of pulses produced by said current to voltage converter; and a comparitor for comparing the number of pulses counted by the counter against a predetermined number, an output of said comparitor indicating whether the semiconductor integrated circuit is operating defectively.

22. The apparatus according to claim 21, wherein the semiconductor integrated circuit has a signal input terminal, and said apparatus further comprises a signal pattern generator for supplying a signal pattern to the signal input terminal of the semiconductor integrated circuit concurrently with the supply of the current to the power input terminal.

23. The apparatus according to claim 22, wherein the signal pattern supplied by said signal pattern generator is a test signal pattern for testing whether the semiconductor integrated circuit is defective, and the predetermined number used by said comparitor is based upon said test signal pattern.

24. The apparatus according to claim 21, wherein said current to voltage converter includes:

a resistance element, a voltage being generated across said resistance due to the power source current, and a comparitor for comparing the voltage generated across said resistance with a predetermined voltage, said comparitor producing said voltage pulse when the voltage generated across said resistance exceeds said predetermined voltage.

25. The apparatus according to claim 24, wherein said resistance is external to the semiconductor integrated circuit.

26. The apparatus according to claim 24, wherein said resistance is connected in series with the power input terminal of the semiconductor integrated circuit such that all of the power source current passes through said resistance.

27. The apparatus according to claim 24, wherein the semiconductor integrated circuit is part of said apparatus and is a CMOS inverter including a P-channel MOS transistor having a source, and said power input terminal is connected to said source of said P-channel transistor, said power input terminal for receiving a positive voltage.

* * * * *